United States Patent [19]

Johannsmeier

[11] 3,940,211

[45] Feb. 24, 1976

[54] STEP-AND-REPEAT PROJECTION ALIGNMENT AND EXPOSURE SYSTEM

[75] Inventor: Karl-Heinz Johannsmeier, Mountain View, Calif.

[73] Assignee: Kasper Instruments, Inc., Mountain View, Calif.

[22] Filed: Sept. 12, 1973

[21] Appl. No.: 396,413

Related U.S. Application Data

[63] Continuation of Ser. No. 126,769, March 22, 1971, abandoned.

[52] U.S. Cl. .................... 355/53; 355/54; 355/86
[51] Int. Cl.² .......................................... G03B 27/42
[58] Field of Search ............ 355/78, 86, 85, 91, 53, 355/54; 356/152

[56] References Cited
UNITED STATES PATENTS

| 3,490,846 | 1/1970 | Kasper | 355/78 |
| 3,542,469 | 11/1970 | Hennings | 355/46 |
| 3,645,622 | 2/1972 | Cachon et al. | 355/78 |

Primary Examiner—Richard A. Wintercorn
Attorney, Agent, or Firm—Roland I. Griffin

[57] ABSTRACT

A wafer-bearing chuck, an annular reference plate, a copy lens system, and a mask-bearing holder are mounted on a floating unit so that the copy lens system produces an image of a pattern-bearing surface of the mask at a plane positioned between the annular reference plate and the wafer chuck and produces an image of a selected pattern-bearing region of a photosensitive-film-bearing surface of the wafer at the pattern-bearing surface of the mask. The wafer chuck is movably mounted for positioning the photosensitive-film-bearing surface of the wafer in abutment with the annular reference plate in a plane parallel to the image plane of the pattern-bearing surface of the mask and for subsequently positioning the selected pattern-bearing surface region of the wafer in the image plane of the pattern-bearing surface of the mask. A stop mechanism may be employed to automatically stop the wafer chuck when the selected pattern-bearing surface region of the wafer is substantially positioned in the image plane of the pattern-bearing surface of the mask. Alternatively, the wafer chuck may be manually adjusted, while viewing the pattern-bearing surface of the mask and the image of the selected pattern-bearing surface region of the wafer through a microscope of an optical unit, to precisely position the selected pattern-bearing surface region of the wafer in the image plane of the pattern-bearing surface of the mask. The mask holder is movably mounted for thereafter aligning the pattern of the mask with the image of pattern of the selected surface region of the wafer while they are viewed through the microscope. The floating unit is floatingly supported within a base unit on three balls and coupled to the base unit by a parallelogram linkage so that the floating unit may be scanned relative to the microscope without rotating relative to the base unit to facilitate and verify alignment of all portions of the pattern of the mask with the image of the pattern of the selected surface region of the wafer. A vacuum clamping mechanism may be employed to clamp the floating unit in any position to which it may be scanned, whereupon the mask holder may be moved to further align the pattern of the mask with the image of the pattern of the selected surface region of the wafer. Upon completion of the pattern alignment operation, the floating unit is unclamped and a centering mechanism employed to automatically return the floating unit to a central position at which an exposure lens system of the optical unit may be employed for exposing the photosensitive film on the selected surface region of the wafer in accordance with the pattern of the mask. A loading arm is mounted on a movable stage secured to the floating unit and is rotated in a plane orthogonally intersecting the first optical axis to move the wafer between a loading station and the wafer chuck. The movable stage is stepped to a plurality of different positions arranged in orthogonal rows and columns so that the loading arm may be employed to move the wafer to a corresponding plurality of different positions on the wafer chuck. This permits a corresponding plurality of different regions of the photosensitive-film-bearing surface of the wafer to be aligned and exposed in accordance with the pattern of the mask.

66 Claims, 7 Drawing Figures

1

STEP-AND-REPEAT PROJECTION ALIGNMENT AND EXPOSURE SYSTEM

This is a continuation of U.S. Pat. Application Ser. No. 126,769, filed on Mar. 22, 1971 now abandoned.

BACKGROUND AND SUMMARY OF THE INVENTION

This invention relates generally to apparatus for aligning a mask with a workpiece and exposing a photosensitive-film-bearing surface of the workpiece in accordance with a pattern of the mask. More particularly, this invention relates to a step-andrepeat projection alignment and exposure system for successively aligning a pattern of a photomask with a plurality of different regions of a photosensitive-film-bearing surface of a semiconductive wafer and exposing the photosensitive film on each of these surface regions in accordance with the pattern of the mask.

In most conventional optical alignment and exposure systems for aligning and exposing a photosensitive-film-bearing surface of a semiconductive wafer in accordance with a pattern of a photomask, the photosensitive-film-bearing surface of the wafer and the pattern-bearing surface of the mask are brought into intimate contact to establish parallel-plane alignment therebetween. The wafer and the mask are then separated to permit out-of-contact alignment of the pattern of the mask and the photosensitive-film-bearing surface of the wafer. After this pattern alignment operation, however, the photosensitive-film-bearing surface of the wafer and the pattern-bearing surface of the mask are again brought into intimate contact and so maintained while the photosensitive film on the surface of the wafer is exposed through the mask. Optical alignment and exposure systems of this type are shown and described, for example, in U.S. Pat. No. 3,192,844 issued July 6, 1965, to Peter R. Szaz et al and in U.S. Pat. No. 3,220,231 issued Nov. 30, 1965, to James A. Evans et al. The mechanical abrasion inevitably produced between the photosensitive-film-bearing surface of the wafer and the pattern-bearing surface of the mask in such optical alignment and exposure systems may scratch or otherwise damage these surfaces. Scratched or otherwise damaged areas on the pattern-bearing surface of the mask are especially undesirable since they will be reproduced on all wafers with which the mask is subsequently used. Moreover, the resolution that can be obtained with conventional alignment and contact printing systems of this type is limited to lines of about 0.1 mil or more in width spaced about 0.1 mil or more apart.

A projection alignment and exposure system for eliminating mechanical abrasion between the photosensitive-film-bearing surface of the wafer and the pattern-bearing surface of the mask has now been developed by AEG-TELEFUNKEN Company of Germany. The resolution that can be obtained with this system is limited to lines of about 5.0 microns or more in width spaced about 5.0 microns or more apart. Neither this projection alignment and exposure system nor the above-described contact printing alignment and exposure systems can be employed to step and repeat the pattern of the mask on different regions of the photosensitive-film-bearing surface of the same wafer and to subsequently step and align the patterns of other masks with the pattern previously formed on each of these same surface regions of the wafer.

In all of the above-described optical alignment and exposure systems the wafer chuck, the mask holder, or both are rigidly supported on a base unit of the system so that external forces acting upon the base unit may also affect the parallel-plane and pattern alignment established between the photosensitive-film-bearing surface of the wafer and the pattern-bearing surface of the mask. Moreover, the wafer chuck is typically mounted for translational and rotational movement in a horizontal plane substantially parallel to the pattern-bearing surface of the mask, as well as, for translational movement along a vertical axis toward and away from the pattern-bearing surface of the mask and pivotal movement about the vertical axis. This tends to impair the stability of the wafer chuck and may therefore also affect the parallel-plane and pattern alignment established between the photosensitive-film-bearing surface of the wafer and the pattern-bearing surface of the mask, thereby degrading the resolution that may be achieved. The foregoing factors limit the usefulness of such optical alignment and exposure systems in fabricating smaller and higher density integrated circuits, or the like, and in high yield production set-ups.

Accordingly, one of the principal objects of this invention is to provide an improved optical alignment and exposure system for aligning a pattern of a mask with a photosensitive-film-bearing surface of a wafer and exposing the photosensitive film on the surface of the wafer in accordance with the pattern of the mask without ever bringing the wafer into contact with the mask and with a resolution that may be extended to lines of 1.0 micron or less in width spaced 1.0 micron or less apart.

Another of the principal objects of this invention is to provide an improved optical alignment and exposure system for aligning a pattern of a mask with a plurality of different surface regions of a wafer and exposing a photosensitive film on each of these surface regions in accordance with the pattern of the mask and for subsequently aligning patterns of other masks with each of these surface regions and exposing photosensitive films thereon in accordance with the patterns of these other masks.

Still another of the principal objects of this invention is to provide an improved optical alignment and exposure system for minimizing the effect of external forces upon the parallel-plane and pattern alignment established between a pattern of a mask and a photosensitive-film-bearing surface of a wafer and for increasing the stability of the wafer chuck and minimizing the required movement thereof to help maintain the parallel-plane and pattern alignment established between the pattern-bearing surface of the mask and the photosensitive-film-bearing surface of the wafer.

These objects are accomplished according to the illustrated preferred embodiment of this invention by providing a step-and-repeat projection alignment and exposure system in which a wafer-bearing chuck, an annular reference plate, and a copy lens system are mounted within a floating unit along a horizontal optical axis and in which a mask-bearing holder is mounted on the floating unit along a vertical optical axis orthogonally intersecting the horizontal optical axis at an inclined mirror also mounted within the floating unit. These elements are arranged so that the copy lens system produces an image of a pattern-bearing surface of the mask at a plane positioned between the annular reference reference plate and the wafer chuck and further produces an image of a selected pattern-bearing region of the photosensitive-film-bearing surface of the wafer at the pattern-bearing surface of the mask. The wafer chuck is supported for pivotal movement about and translational movement along the horizontal optical axis so that an unused marginal portion of the photosensitive-film-bearing surface of the wafer may be moved forward into face-to-face abutment with an annular reference surface of the annular plate to orient the photosensitive-film-bearing surface of the wafer in parallel-plane alignment with the image plane of the pattern-bearing surface of the mask and so that the selected pattern-bearing surface region of the wafer may then be moved backward into the image plane of the pattern-bearing surface of the mask. A stop mechanism movable with the wafer chuck may be clamped to the floating unit when the photosensitive-film-bearing surface of the wafer is in face-to-face abutment with the annular reference surface of the annular plate to automatically stop the wafer chuck when the selected pattern-bearing surface region of the wafer is substantially positioned in the image plane of the pattern-bearing surface of the mask. Alternatively, a microscope of an optical unit pivotally mounted on a base unit and positioned above the mask holder may be employed for viewing the pattern-bearing surface of the mask and the image of the selected pattern-bearing surface region of the wafer while the wafer chuck is manually adjusted to precisely position the selected pattern-bearing surface region of the wafer at the image plane of the pattern-bearing surface of the mask. The optical unit is provided with a rotatable turret for positioning a selected objective lens system of the microscope in optical alignment with a stationary ocular lens system of the microscope during this wafer-focusing and subsequent wafer-focusing and pattern-alignment operations. Three beams of illuminating light are projected through the mirror and along the horizontal optical axis so that only three spaced portions of the photosensitive-film-bearing surface of the wafer are illuminated during these wafer-focusing and pattern-alignment operations.

The mask holder is mounted for translational and rotational movement in a horizontal plane orthogonally intersecting the vertical optical axis so that after the above-described wafer-focusing operation the mask holder may be adjusted to align the pattern of the mask with the image of the pattern of the selected surface region of the wafer while they are viewed through the microscope of the optical unit. The floating unit is floatingly supported, for example, on three balls captivated within the base unit so that the floating unit and, hence, the wafer chuck and the mask holder together as a unit, may be scanned relative to the microscope of the optical unit to facilitate and verify alignment of all portions of the pattern of the mask with the image of the pattern of the selected surface region of the wafer. Mounting the floating unit in this manner also prevents external forces acting on the base unit from affecting the floating unit and, hence, the parallel-plane and pattern alignment established between the pattern of the mask and the image of the pattern of the selected surface region of the wafer. The floating unit is also coupled to the base unit by a parallelogram linkage to prevent the floating unit from rotating relative to the base unit. A clamping mechanism comprising, for example, a pair of vacuum cups secured to the base unit and spring biased into sliding abutment upon a pair of plates secured to the floating unit may be employed to clamp the floating unit in any position to which it may be scanned, whereupon the mask holder may be adjusted to further align the pattern of the mask with the image of the pattern of the selected surface region of the wafer. Following this pattern alignment operation, the floating unit is unclamped and a centering mechanism employed to automatically move the floating unit to a central position at which an exposure lens system of the optical unit will be aligned with the vertical optical axis upon being rotated by the turret to an operative position for receiving a beam of exposure light. The centering mechanism may comprise, for example, three roller bearings pivotally secured to the base unit and normally clustered within an enlarged cylindrical aperture of the floating unit to permit movement of the floating unit relative to the base unit, but pivotable outward into engagement with the wall of this enlarged cylindrical aperture to force the floating unit to the central position.

A loading arm is mounted on a movable stage secured to the floating unit above the wafer chuck and is supported for angular movement in a vertical plane orthogonally intersecting the horizontal optical axis. The movable stage may be stepped to a plurality of different positions arranged in orthogonal rows and columns. When it is stepped to a central position, the loading arm may be employed to pick up a wafer at a loading station and deposit the wafer upon the wafer chuck in a central position so that a central pattern-bearing surface region of the wafer may be aligned and a photosensitive film thereon exposed in accordance with the pattern of the mask. Following these alignment and exposure operations, the loading arm may be employed to pick up the wafer from the wafer chuck, the movable stage stepped to a different position, and the loading arm employed to redeposit the wafer upon the vacuum chuck in a different position so that a different pattern-bearing surface region of the wafer may be aligned and a photosensitive film thereon exposed in accordance with the pattern of the same mask. This may be repeated until the last pattern-bearing surface region of the wafer has been aligned and the photosensitive film thereon exposed in accordance with the pattern of the mask. The loading arm is then employed once again to pick up the wafer from the wafer chuck, after which the movable stage is again stepped to the central position and the loading arm employed to return the wafer to the loading station. Subsequently, the loading arm and the movable stage on which it is mounted may be similarly employed to align each of the previously aligned pattern-bearing surface regions of the wafer and expose photosensitive films thereon in accordance with the patterns of other masks.

Other and incidental objects of this invention will become apparent from a reading of this specification and an inspection of the accompanying drawings.

DESCRIPTION OF THE DRAWINGS

FIG. 7 is a sectional side elevational view of the loading arm assembly of the system of FIGS. 1–6 taken along section line 7—7 of FIG. 2.

DESCRIPTION OF THE PREFERRED EMBODIMENT

Figure 1:
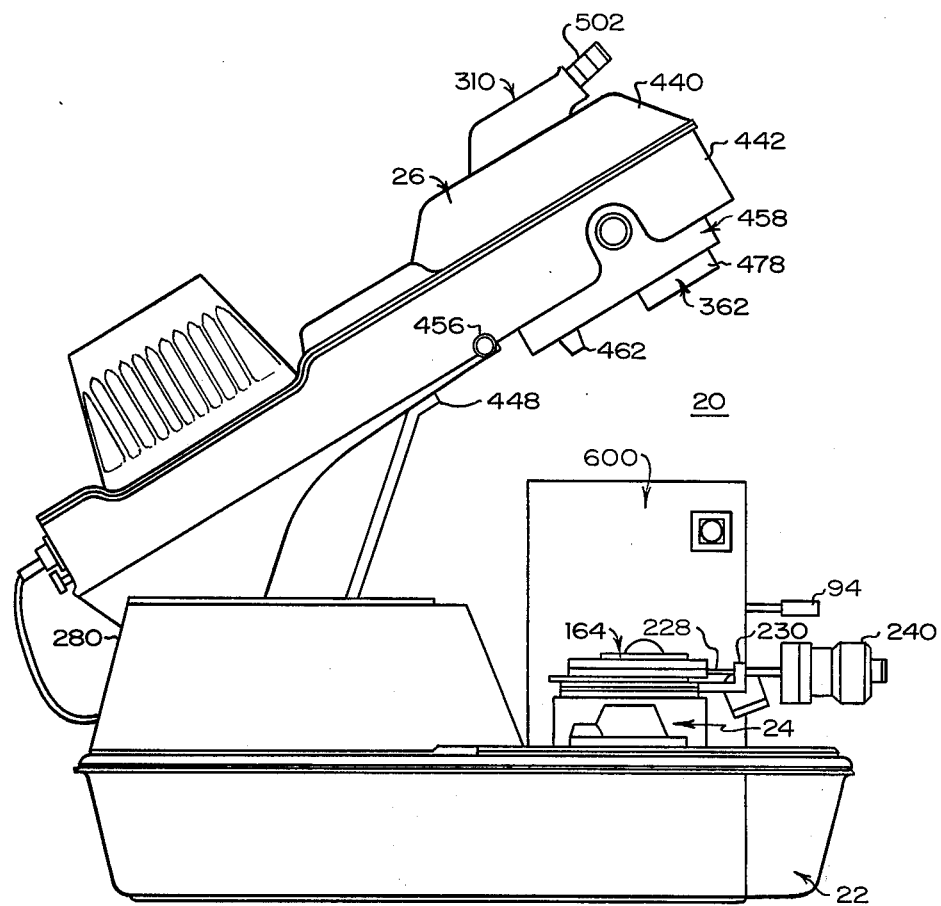
FIG. 1 is a side elevational view of a step-and-repeat projection alignment and exposure system according to the preferred embodiment of this invention.
Figure 2:
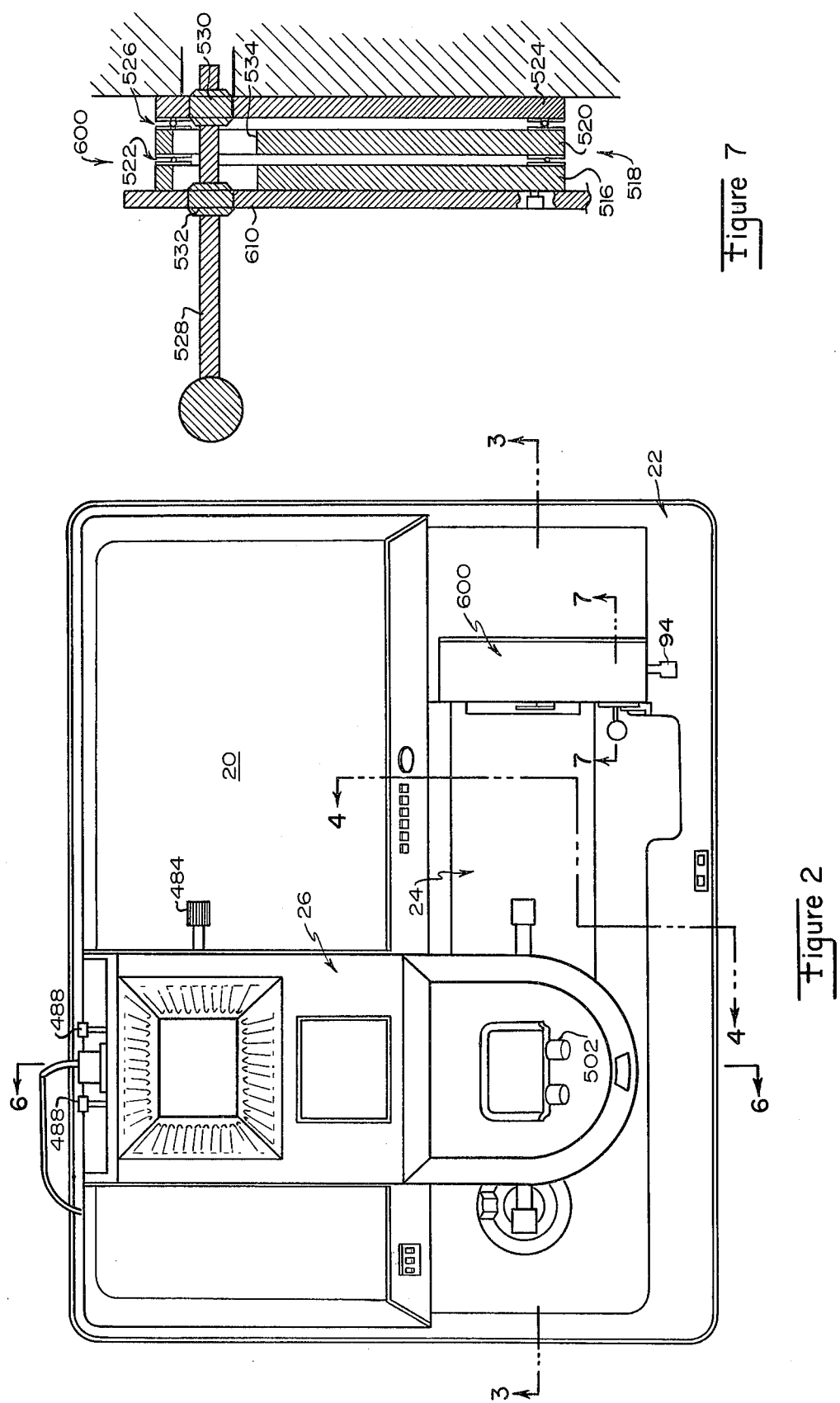
FIG. 2 is a top plan view of the system of FIG. 1.
Figure 3:
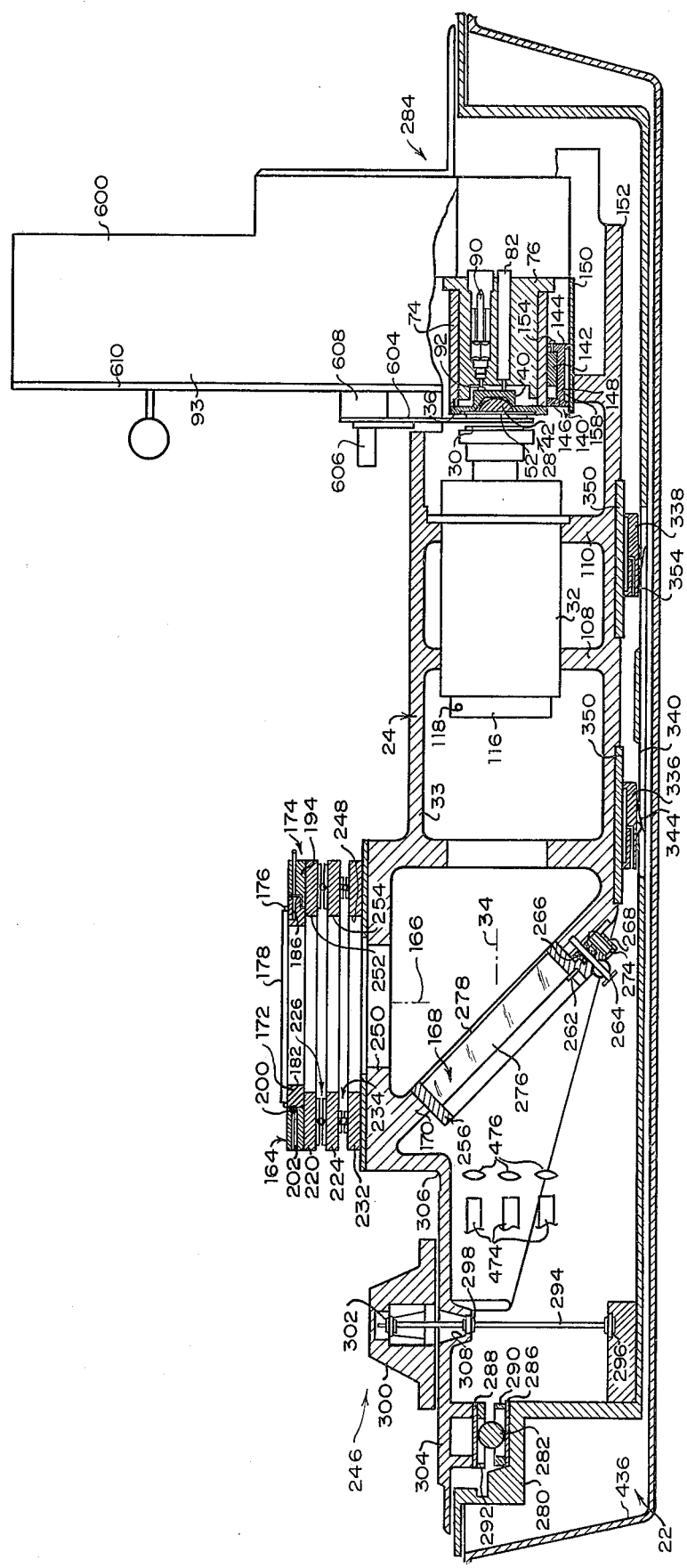
FIG. 3 is a sectional front elevational view of the floating unit and the base unit of the system of FIGS. 1 and 2 taken along section line 3—3 of FIG. 2.

Referring now to FIGS. 1–3, there is shown a step-and-repeat projection alignment and exposure system 20 according to the preferred embodiment of this invention. This system includes a base unit 22, a floating unit 24, and an optical unit 26. As best shown in FIG. 3, a wafer chuck 28, an annular reference plate 30, and a copy lens system 32 are coaxially mounted within a generally rectangular housing 33 of floating unit 24 at spaced positions along a horizontal optical axis 34. Wafer chuck 28 comprises a circular chuck plate 36 secured by a pair of springs to a chuck holder 40 coaxially disposed along horizontal optical axis 34. A bearing member 42 in the form of a section of a sphere is secured to chuck plate 36 and seated in a central conically-shaped recess of chuck holder 40 so that the center of radius of the bearing member is located at substantially the center of the outermost surface of the chuck plate, so that clearance space is provided between the chuck plate and the chuck holder, and so that the outermost surface of the chuck plate extends slightly beyond the outermost surface of the chuck holder. Wafer chuck 28 may therefore be pivoted about horizontal optical axis 34 as required to orient a photosensitive-film-bearing surface of a semiconductive wafer 52 in a vertical plane orthogonally intersecting the horizontal optical axis. Wafer chuck 28 and chuck holder 40 are vacuum clamped together so that the resultant frictional engagement between bearing member 42 of the wafer chuck and the conically recessed portion of the chuck holder is increased sufficiently to maintain the wafer chuck in whatever position it may be pivoted to while still permitting the wafer chuck to be pivoted relative to the chuck holder. This is accomplished by connecting a first flexible tube communicating with a first passageway axially extending through the conically recessed portion of chuck holder 40 to a source of vacuum. Wafer chuck 28 may be unclamped from chuck holder 40 by disconnecting the first flexible tube from the source of vacuum.

A circular perforated plate is concentrically and fixedly secured on a central recessed portion of chuck plate 36 so that the outermost surfaces of the perforated plate and the chuck plate lie in substantially the same plane. The perforated plate covers a plurality of interconnected radial grooves formed in the central recessed portion of chuck plate 36. These grooves communicate with a second passageway laterally extending to the periphery of chuck plate 36 and communicating with a second flexible tube. Wafer 52 may therefore be vacuum clamped on wafer chuck 28 by drawing a vacuum through the perforated plate, the radial grooves, the second passageway, and the second flexible tube. This is accomplished by actuating a first solenoid-operated control valve to connect the second flexible tube to the source of vacuum. Wafer 52 may subsequently be unclamped from wafer chuck 28 by actuating the first solenoid-operated control valve to vent the second flexible tube to the atmosphere or, alternatively, to connect it to a source of air pressure.

Wafer chuck 28 is supported for translational movement along horizontal optical axis 34 by a sleeve-like cylindrical part 74 that is fixedly secured to chuck holder 40 and that telescopically surrounds a cylindrical guide 76 coaxially disposed along the horizontal optical axis and fixedly secured to an annular flange of floating unit housing 33. A piston of a first air cylinder 82 fixedly mounted within a cylindrical cavity of guide 76 is fixedly secured to chuck holder 40. Wafer chuck 28 may therefore be moved forward along horizontal optical axis 34 toward annular reference plate 30 by actuating a second solenoid-operated control valve to connect a third flexible tube communicating with the first air cylinder 82 between the back end of the piston and the back end of the air cylinder to the source of air pressure. Similarly, wafer chuck 28 may be moved backward along horizontal optical axis 34 away from annular reference plate 30 by actuating the second solenoid-operated control valve to vent the third flexible tube to the atmosphere and thereby permit expansion of a return spring mounted within the first air cylinder 82 between the front end thereof and the back end of the piston. If a first air cylinder without a return spring should be employed, wafer chuck 28 could be moved backward by actuating the second solenoid-operated control valve to connect the third flexible tube to the source of vacuum. A micrometer screw 90 is threadedly mounted within another cylindrical cavity of guide 76 and positioned for abutment upon a convex portion 92 of chuck holder 40 to stop the backward movement of wafer chuck 28. Once chuck holder 40 and micrometer screw 90 are brought into abutment, they are so maintained by the return spring of the first air cylinder 82. Micrometer screw 90 may therefore be employed to precisely and positively adjust the position of wafer chuck 28 without any creeping of the wafer chuck during the adjustment. A focus adjustment spindle 94 (see FIGS. 1 and 2) mounted on an upright portion 93 of floating unit housing 33 is coupled to micrometer screw 90 by a cable engaging an idler pulley and a pair of pulleys fixedly attached to the focus adjustment spindle and the micrometer screw, respectively. This permits the position of micrometer screw 90 and, hence, wafer chuck 28 to be precisely adjusted by manually turning focus adjustment spindle 94.

Annular reference plate 30 is fixedly secured to the housing of the copy lens system 32 adjacent to wafer chuck 28. It is provided with an optically flat annular reference surface that faces wafer chuck 28 and lies in a vertical plane orthogonal to horizontal optical axis 34.

Copy lens system 32 is mounted within a cylindrical housing supported by annular flanges 108 and 110 of floating unit housing 33 and is fixedly secured to annular flange 110. It includes an alignment lens mounted within a cylindrical case 116 pivotally supported at the front end of the lens housing by a pin 118 fixedly secured to the upper front end of the lens housing. A lever is fixedly secured at one end to the upper portion of casing 116 and pivotally secured at the other end by a pin to a bifurcated end of a piston of a second air cylinder supported adjacent to the lens housing. The back end of the second air cylinder is pivotally secured to annular flange 110 of floating unit housing 33 opposite a recessed portion of flange 108 by a pin fixedly secured to a bifurcated bracket which is in turn fixedly secured to annular flange 110. The alignment lens may therefore be pivoted to a raised inoperative position by actuating a third solenoid-operated control valve to connect a fourth flexible tube communicating with the second air cylinder between the front end thereof and the back end of its piston to the source of air pressure. This adjusts copy lens system 32 as required for use with ultraviolet exposure light of, for example, 4358±75A. The alignment lens may be pivoted back to the illustrated, lowered operative position the fourth flexible tube to the atmosphere and thereby permit expansion of a return spring mounted within the second air cylinder between the back end thereof and the back end of its piston. If a second air cylinder without a return spring should be employed, the alignment lens be pivoted back to the lowered operative position by actuating the third solenoid-operated control valve to connect the fourth flexible tube to the source of vacuum. In either case, this adjusts copy lens system 32 as required for use with visible illuminating light of, for example, around 5461±100A. Copy lens system 32 may comprise, for example, a 10:1, 4:1, 2:1, or 1:1 copy and alignment lens system of a type manufactured and sold by Tropel Incorporated of Fairport, N.Y. These copy and alignment lens systems may be interchangeably employed in the same floating unit by ordering them with the same optical conjugates or by providing the floating unit housing with an adjustable mounting structure to accommodate different copy and alignment lens systems. The resolution and the field coverage that can be obtained with each of these copy and alignment lens systems is given in the chart below.

| COPY LENS SYSTEM | RESOLUTION IN LINE WIDTH | FIELD COVERAGE |
|---|---|---|
| 10:1 | 1 MICRON | 8 MILLIMETERS |
| 4:1 | 1.5 MICRONS | 0.7 INCH |
| 2:1 | 2 MICRONS | 1.5 INCHES |
| 1:1 | 2.5 MICRONS | 2 INCHES |

As best shown in FIGS. 1 and 3, a mask holder 164 is mounted on floating unit housing 33 along a vertical optical axis 166 orthogonally intersecting horizontal optical axis 34 at a circular mirror 168 adjustably mounted on an annular flange 170 of the floating unit housing. Mask holder 164 comprises a circular top plate 172 of a rotary stage 174. Top plate 172 is provided with three locating lugs 176 for locating a photomask 178 on its upper surface over a circular aperture 182 axially extending therethrough. Photomask 178 is made of glass or some other transparent material and provided on its lower surface with a geometric pattern to be projected onto the photosensitive-film-bearing surface of wafer 52. It is vacuum clamped in place on mask holder 164 by drawing a vacuum through a passageway 186 laterally extending through top plate 172 and communicating with an annular groove formed in the upper surface of top plate 172 around aperture 182 and beneath an unused marginal portion of the photomask. This is accomplished by actuating a fourth solenoid-operated control valve to connect a fifth flexible tube passing through an enlarged slot in an annular base plate 194 of rotary stage 174 and communicating with passageway 186 to the source of vacuum. Photomask 178 may subsequently be unclamped from mask holder 164 by actuating the fourth solenoid-operated control valve to vent the fifth flexible tube to the atmosphere.

Rotary stage 174 is provided by rotatably supporting an annular flange of top plate 172 upon an annular flange of base plate 194. Top plate 172 and aperture 182 axially extending therethrough are maintained in axial alignment with base plate 194 by three ball bearings 200 mounted in cylindrical holes 202 spaced along the inner periphery of the base plate and spring loaded against a V-shaped groove formed in the outer periphery of the flange of top plate 172. Ball bearings 200 are spring loaded against the lowermost side of this V-shaped groove to hold the flange of top plate 172 in slidable abutment with the flange of base plate 194. A ball carried at the end of a pin fixedly attached to the flange of top plate 172 is engaged between a pair of push rods and slidably mounted within a channel laterally extending through base plate 194. One of these push rods is engaged by an adjustment screw threadedly mounted at one end of this channel. A spring mounted within this channel between the other of these push rods and a stop screw threadedly mounted at the other end of the channel keeps the ball engaged between these push rods. Mask holder 164 may therefore be rotated clockwise or counterclockwise about an axis parallel to vertical optical axis 166 by turning the adjustment screw.

Base plate 194 of rotary stage 174 is fixedly mounted on a square top plate 220 of an X-Y stage of, for example, the type manufactured and sold by Scherr-Tumico Company of Saint James, Minnesota. In an X-Y stage of this type top plate 220 is reciprocally mounted on a square intermediate plate 224 by bearing supports 226 and is spring loaded against a micrometer screw 228 threadedly mounted in a bracket 230 fixedly secured to the intermediate plate of the X-Y stage. Intermediate plate 224 is in turn reciprocally mounted on a base plate 232 by bearing supports 234 oriented at right angles to bearing supports 226 and is spring loaded against another micrometer screw threadedly mounted in another bracket fixedly secured to base plate 232. An X adjustment spindle 240 and a Y adjustment spindle are mechanically coupled to these micrometer screws. Base plate 194 of rotary stage 174 and, hence, mask holder 164 may therefore be moved in any direction in a horizontal plane orthogonally intersecting vertical optical axis 166 by turning the X and Y adjustment spindles.

Base 232 of the X-Y stage is fixedly secured to a top plate of floating unit housing 33 toward one side 246 thereof. Circular apertures 248 and 250 axially extend through base plate 232 of the X-Y stage and this top plate of floating unit housing 33 in axial alignment with aperture 182 axially extending through rotary stage 174 of mask holder 164. Enlarged circular apertures 252 and 254 axially extend through top plate 220 and intermediate plate 224 of the X-Y stage so that translational movement of these plates will not obstruct the passage of light between mask 178 and mirror 168.

As best shown in FIG. 3, mirror 168 is mounted within an annular retainer 256 and held in abutment against three symmetrically spaced projections thereof by three cushions fixedly secured to three retaining plates 262, which are in turn fixedly secured to retainer 256 opposite these projections. Retainer 256 and, hence, mirror 168 are adjustably secured to flange 170 of floating unit housing 33 at an angle of 45° with respect to vertical and horizontal optical axes 34 and 166 by three adjustment screws 264. These adjustment screws axially extend through three clearance holes 266 passing through three spaced bosses 268 of retainer 256 and threadedly engage three holes in flange 170 of floating unit housing 33. Retainer 256 is maintained in abutment with the heads of adjustment screws 264 by three springs supported within enlarged portions of clearance holes 266 around the adjustment screws and between the bottoms of these enlarged portions of the clearance holes and flange 170 of the floating unit housing. Thus, by adjusting adjustment screws 264, mirror 168 may be precisely oriented at 45° with respect to horizontal and vertical optical axes 34 and 166 and precisely positioned relative to mask holder 164 and copy lens system 32 to optimize the magnification provided by the copy lens system. Once this is accomplished, three set screws 274 threadedly mounted in bosses 268 of retainer 256 are screwed into abutment with flange 170 of floating unit housing 33 to hold mirror 168 in place and thereby avoid the need for subsequently readjusting the mirror. Mirror 168 comprises an optically flat glass plate 276 having a dichroic-coated surface 278 that is substantially one-hundred percent reflective to ultraviolet exposure light of about 4358±75 A and that is about fifty percent transmissive to visible illuminating light of about 5461±100A. It may be purchased, for example, from Tropel Incorporated of Fairport, New York.

Figure 4:
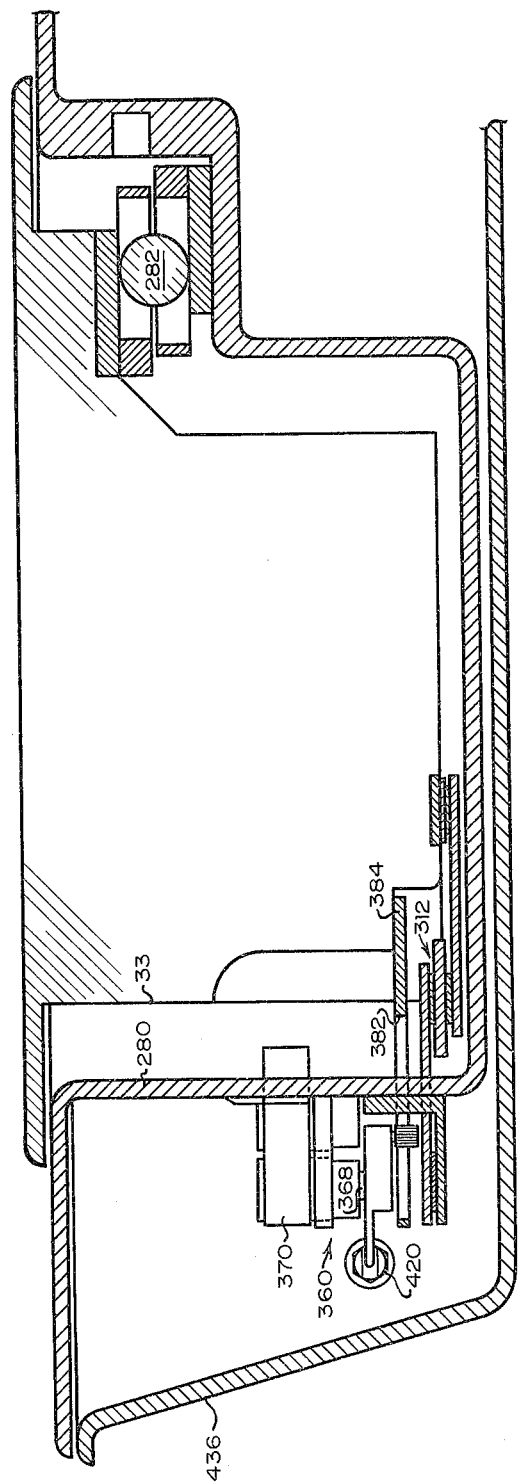
FIG. 4 is a sectional side elevational view of the floating unit and a portion of the base unit of the system of FIGS. 1–3 taken along section line 4—4 of FIG. 2.

As best shown in FIGS. 3 and 4, floating unit 24 is floatingly supported on an intermediate housing 280 of base unit 22 by three balls 282 supported on the intermediate housing adjacent to side 246 of floating unit housing 33 and adjacent to the front and back of the floating unit housing toward side 284 thereof. Each ball 282 is captivated between a lower flat rectangular plate 286 fixedly secured to intermediate housing 280 and an upper flat rectangular plate 288 fixedly secured to floating unit housing 33. This is accomplished by a lower annular retainer 290 fixedly secured to lower plate 286 and an upper annular retainer 292 fixedly secured to upper plate 288. A cylindrical shaft 294 is pivotally secured toward one end thereof to intermediate housing 280 by a spherical ball joint 296, toward the middle thereof to floating unit housing 33 by another spherical ball joint 298, and toward the other end thereof to a control handle 300 by still another spherical ball joint 302. Control handle 300 is slidably supported on a flat circular portion 304 of a top panel 306 of floating unit housing 33 and is positioned over a circular aperture 308 axially extending through top panel 306. Thus, by manually moving control handle 300 along portion 304 of top panel 306, floating unit 24 and, hence, mask 178 vacuum clamped on mask holder 164 and the image of wafer 52 vacuum clamped on wafer chuck 28 may be horizontally scanned relative to optical unit 26.

Figure 5:
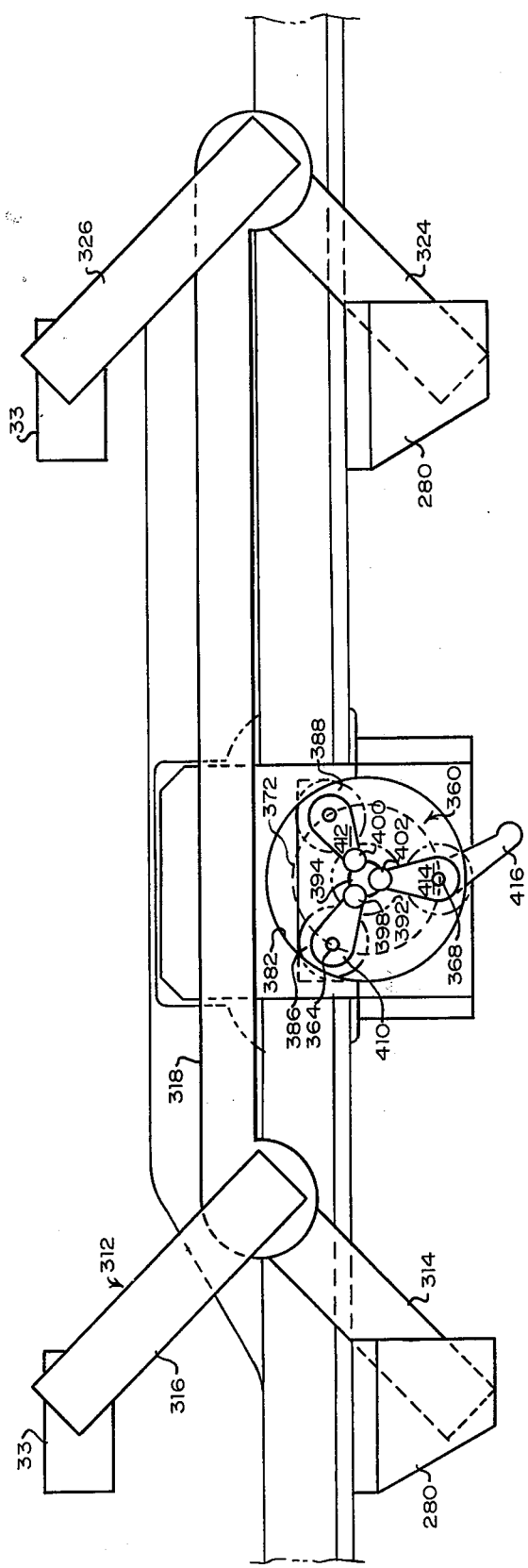
FIG. 5 is a simplified top plan view of the centering mechanism and of the parallelogram linkage coupled between the floating unit and the base unit of the system of FIGS. 1–4.

As best shown in FIGS. 4 and 5, floating unit housing 33 is coupled to intermediate housing 280 by a parallelogram linkage 312. this parallelogram linkage comprises a pair of links 314 and 316 pivotally secured at one end thereof to opposite sides of one end of a longer link 318 by a pair of concentric roller bearings. It further comprises an identical pair of links 324 and 326 pivotally secured at one end thereof to opposite sides of the other end of link 318 by a pair of concentric roller bearings. Links 314 and 324 are pivotally secured at the other end thereof to the bottom of intermediate housing 280 by another pair of roller bearings. Similarly, links 316 and 326 are pivotally secured at the other end thereof to the bottom of floating unit housing 33 by still another pair of roller bearing. This prevents floating unit 24 from rotating relative to base unit 22 and optical unit 26 while the floating unit is being scanned relative to the optical unit.

As best shown in FIG. 3, two shallow cylindrical cups 336 and 338 are fixedly secured at opposite tapered ends of a leaf spring 340 by two screws. Leaf spring 340 is reinforced by a similar leaf spring 344, opposite tapered ends of which abut upon the heads of these screws. These leaf springs are fixedly secured to intermediate housing 280 so that cups 336 and 338 project upwardly and slidably abut upon two flat circular plates 350 fixedly secured to the bottom of floating unit housing 33. Leaf springs 340 and 344 prevent cups 336 and 338 from moving horizontally, while maintaining them in slidable face-to-face abutment with plates 350. Floating unit 24 may therefore be vacuum clamped in any position to which it may be scanned by drawing a vacuum through two passageways 354 laterally extending through cups 336 and 338, respectively, and communicating with the interiors thereof adjacent to plates 350. This may be accomplished by actuating a fifth solenoid-operated control valve to connect a sixth flexible tube communicating with passageways 354 to the source of vacuum. Floating unit 24 may subsequently be unclamped by actuating the fifth solenoid-operated control valve to vent the sixth flexible tube to the atmosphere.

When floating unit 24 is unclamped, a centering mechanism 360 (see FIGS. 4 and 5) may be employed to automatically move the floating unit to a central position at which vertical optical axis 166 will be axially aligned with an exposure lens system 362 of optical unit 26 (see FIGS. 1 and 6) once the exposure lens system is rotated to an operative position. As shown in FIGS. 4 and 5, centering mechanism 360 comprises three upright cylindrical shafts 364, 366, and 368 rotatably mounted on a base plate 370 at symmetrically spaced positions along a circle 372 by three roller bearings. Base plate 370 of centering mechanism 360 is fixedly secured to a flange of intermediate housing 280 opposite a circular aperture 382 axially extending through a rectangular plate 384 fixedly secured to floating unit housing 33. Three gears 386, 388, and 390 fixedly secured to shafts 364, 366, and 368, respectively, are engaged by a fourth gear 392 fixedly secured to a fourth upright cylindrical shaft 394 rotatably mounted on base plate 370 at the center of circle 372 by another roller bearing. Three roller bearings 398, 400, and 402 are rotatably mounted on three upright pins fixedly secured to the ends of three levers 410, 412, and 414, which are in turn fixedly secured to shafts 364, 366, and 368 adjacent to gears 386, 388, and 390, respectively. Levers 410, 412, and 414 are arranged to rotate roller bearings 398, 400, and 402 between a clustered inoperative position within circular aperture 382, as shown in solid lines in FIG. 5, and an extended operative position at which roller bearings 398, 400, and 402 abut upon the wall of circular aperture 382. When floating unit 24 is unclamped, the abutment of roller bearings 398, 400, and 402 upon the wall of circular aperture 382 in their extended operative position forces the floating unit to its central position described above.

An outwardly extending portion 416 of lever 414 is pivotally secured to a bifurcated end of a piston of a third air cylinder 420 by a pin. The back end of the third air cylinder 420 is pivotally secured to a flange of intermediate housing 280 by a pin fixedly secured to a bifurcated bracket, which is in turn fixedly secured to this flange. Roller bearings 398, 400, and 402 may therefore be rotated to their extended operative position by actuating a sixth solenoidoperated control valve to connect a seventh flexible tube communicating with the third air cylinder 420 between the back end thereof and the back end of piston 418 to the source of air pressure. This automatically returns floating unit 24 to its central position. Subsequently, roller bearings 398, 400, and 402 may be rotated back to their clustered inoperative position by actuating the sixth solenoid-operted control valve to vent the seventh flexible tube to the atmosphere and thereby permit expansion of a return spring mounted within the third air cylinder 420 between the front end thereof and the back end of its piston. If a third air cylinder without a return spring should be employed, roller bearings 398, 400, and 402 may be rotated to their clustered inoperative position by actuating the sixth solenoid-operated control valve 430 to connect the seventh flexible tube to the source of vacuum. in either case, this permits floating unit 24 to be scanned relative to optical unit 26 (see FIGS. 1 and 2) unless the floating unit is vacuum clamped in place as described above.

As shown in FIG. 3, intermediate housing 280 is supported within a rectangular outer housing 436 of base unit 22 upon four rubber shock absorbers fixedly secured to the base of the outer housing toward the corners thereof. Mounting intermediate housing 280 within outer housing 436 in this manner and in turn mounting floating unit housing 33 within the intermediate housing upon three balls 282 as described above serves to prevent external forces acting on base unit 22 from affecting floating unit 24 and impairing the resolution that may be achieved with the projection alignment and exposure system.

Figure 6:
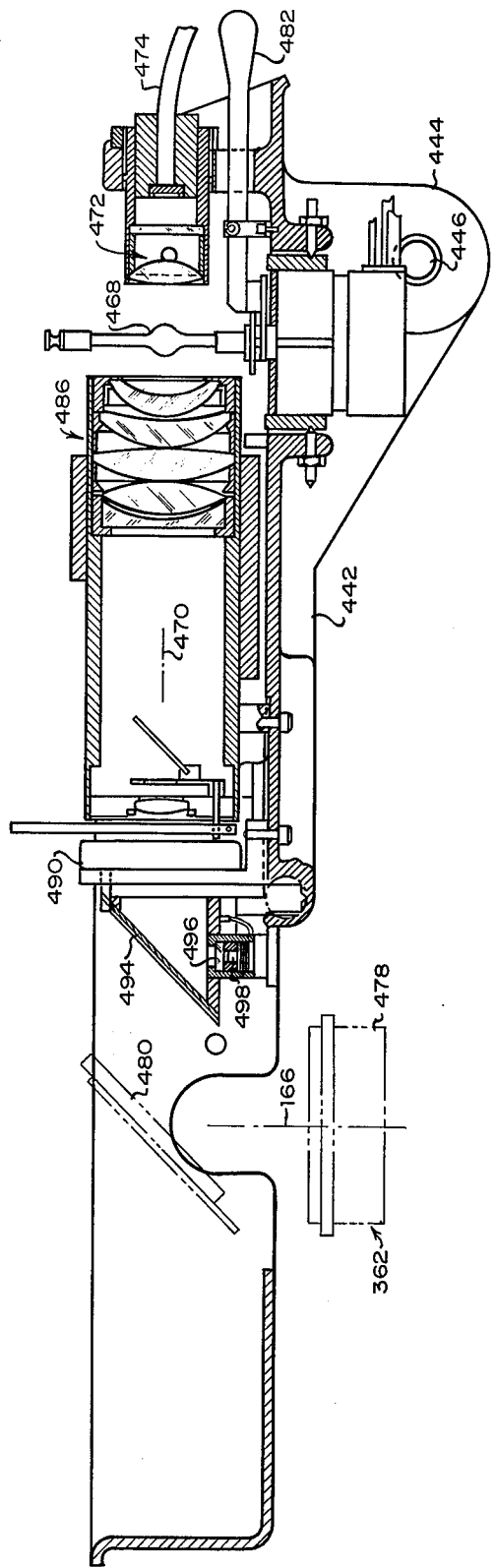
FIG. 6 is a sectional side elevational view of the optical unit of the system of FIGS. 1–5 taken along section line 6—6 of FIG. 2.

As best shown in FIGS. 1–2 and 6, optical unit 26 includes an inner housing 440 upon which a microscope 310 is mounted and an outer housing 442 within which inner housing 440 is mounted. Except as differently set forth below, optical unit 26 may be contructed and operated in substantially the same manner as the optical unit shown and described in detail in connection with FIGS. 1–10 of U.S. Pat. No. 3,490,846 entitled OPTICAL ALIGNMENT AND EXPOSURE APPARATUS and issued on Jan. 20, 1970. Optical unit 26 is pivotally mounted on base unit 22 above mask holder 164 by rotatably securing a pair of spaced brackets 444 projecting downwardly from the back of outer housing 442 to a pin 446 that is fixedly secured to the back of intermediate housing 280 in the same manner as shown and described in connection with FIG. 3 of U.S. Pat. No. 3,490,846. This permits optical unit 26 to be pivoted between a raised inoperative position shown in FIG. 1 and a lowered operative position shown in FIG. 2. Optical unit 26 may be pivoted to the raised inoperative position manually or by employing a lever 448 or a bell crank arrangement driven by a fourth air cylinder in the same manner as shown and described in connection with FIG. 3 of U.S. Pat. No. 3,490,846. The lever 448 or bell crank arrangement and, hence, optical unit 26 may be raised by actuating a seventh solenoid-operated control valve to connect an eighth flexible tube communicating with the fourth air cylinder to the source of air pressure. When optical unit 26 is in the raised inoperative position, mask 178 may readily be loaded onto or unloaded from mask holder 164. Optical unit 26 may also be pivoted back to the lowered operative position manually or by actuating the seventh solenoid-operated control valve to vent the eighth flexible tube to the atmosphere and thereby lower the lever 448 or bell crank arrangement. When optical unit 26 is in the lowered operative position it may be employed for viewing the patternbearing surface of mask 178 and an image of a selected region of the photosensitive-film-bearing surface of wafer 52 and for exposing the selected region of the photosensitive-film-bearing surface of the wafer in accordance wih the pattern of the mask.

Inner housing 440 is mounted for vertical adjustment relative to outer housing 442 under control of a focus adjustment knob 456 in the same manner as shown and described in connection with FIGS. 1–3 and 7 of U.S. Pat. No. 3,490,846. A microscope 310 mounted on inner housing 440 may therefore be focused relative to the pattern-bearing surface of mask 178 by adjusting focus adjustment knob 456 while optical unit 26 is in its lowered operative position.

A rotatable turret 458 is constructed and rotatably mounted on inner housing 440 in the same manner as shown and described in connection with FIGS. 7 and 8 of U.S. Pat. No. 3,490,846. Rotatable turret 458 is positioned toward the front of inner housing 440 adjacent to a circular aperture in outer housing 442. A plurality of different objective lens systems 462 of microscope 310 and, in addition, exposure lens system 362 are fixedly mounted on rotatable turret 458 at different turret positions. The objective lens systems of microscope 310 may comprise, for example, a single-field row and column objective lens system and a pair of adjustable splitfield objective lens systems of different magnification. They may be constructed like those shown and described in connection with FIGS. 7–10 of U.S. Pat. No. 3,490,846, except that they are illuminated by visible illumination light of about $5461 \pm 100$A introduced through mirror 168.

The illumination light is generated by a mercury arc lamp 468 mounted within outer housing 442 along another horizontal optical axis 470 orthogonally intersecting vertical optical axis 166 when floating unit 24 is in its central position and optical unit 26 is in its lowered operative position. A collector lens system 472 fixedly mounted within outer housing 442 adjacent to mercury arc lamp 468 and along horizontal optical axis 470 collects the illumination light generated by the mercury arc lamp. The collected illumination light is transmitted to floating unit housing 33 by three fiber optic light pipes 474 fixedly mounted at one end in a cluster adjacent to collection lens system 472. As shown in FIG. 3, these three fiber optic light pipes 474 are fixedly mounted at the other end in vertical alignment adjacent to three focusing lenses 476, which are in turn fixedly mounted adjacent to mirror 168 and along horizontal optical axis 34. Focusing lenses 476 project the collected and transmitted illumination light in three vertically spaced beams through mirror 168 and along horizontal optical axis 34 to the photosensitive-film-bearing surface of wafer 52. Illuminating only three spaced portions of the photosensitive-film-bearing surface of wafer 52 in this manner eliminates glare that otherwise results from passage of the illumination light through the optics of floating unit 24.

Referring again to FIG. 6, exposure lens system 362 may comprise, for example, a two-hundred to 500 watt short-arc-condensor field lens system 478 and a mirror 480, which is substantially 100 percent reflective to ultraviolet exposure light of about 4358±75A. Mirror 480 is mounted above field lens system 478 at an angle of 45° with respect to vertical optical axis 166 and horizontal optical axis 470, when exposure lens system 362 is in an operative position aligned with vertical optical axis 166. A bean of ultraviolet exposure light projected forward along horizontal optical axis 470 is therefore reflected by mirror 480 downwardly through field lens system 478 and along vertical optical axis 166 when the exposure lens system is in its operative position.

The ultraviolet exposure light is generated by mercury arc lamp 468, which is mounted for vertical adjustment relative to outer housing 442 under control of an adjustment lever 482 and stop screw 484 (see FIG. 2) in the same manner as shown and described in connection with FIGS. 3 and 4 of U.S. Pat. No. 3,490,846. A two-hundred to 500 watt short-arc-condensor lens system 468 mounted within outer housing 442 adjacent to mercury-arc lamp 468 and along horizontal optical axis 470 collects the ultraviolet exposure light generated by the mercury-arc lamp and projects it forward in a single beam along horizontal optical axis 470. Condensor lens system 486 is mounted for horizontal adjustment relative to mercury-arc lamp 468 under control of a pair of push rods 488 (see FIG. 2) in the same manner as shown and described in connection with FIGS. 3–4 of U.S. Pat. No. 3,490,846. A solenoid-operated shutter 490 fixedly mounted within outer housing 442 and along horizontal optical axis 470 between condensor lens system 486 and mirror 480 controls passage of the beam of ultraviolet exposure light to the exposure lens system.

The amount of ultraviolet exposure light passed by soleniodoperated shutter 490 may be controlled by employing an adjustable timer switch of the type manufactured and sold by Bristol Motors of Old Saybrook, Connecticut to control the length of time the solenoid-operated shutter remains opened after being actuated. Alternatively, a portion of the beam of ultraviolet exposure light passed by solenoid-operated shutter 490 may be deflected downwardly by a beam splitter 494 fixedly mounted within outer housing 442 adjacent to the solenoid-operated shutter and at an angle of 45° with respect to horizontal optical axis 470. The deflected exposure light is passed through an ultraviolet light transmissive filter 496 fixedly mounted within outer housing 442 directly below the beam splitter and is converted to an electrical signal by a photosensitive diode 498 also fixedly mounted within outer housing 442 directly below the ultraviolet light transmissive filter. This electrical signal is fed to a light-integrating shutter controller coupled to solenoid-operated shutter 490 to precisely control the amount of ultraviolet exposure light passed by the solenoid-operated shutter. The light-integrating shutter controller may be of the type manufactured and sold by Kasper Instruments, Inc. of Mountain View, Calif. in connection with the Kasper Model 1,900A alignment and exposure system. All of the other optics of the above-described mercury-arc illumination and exposure system may be of, for example, the type manufactured and sold by Tropel Inc. of Fairport, N. Y.

As shown in FIGS. 1, 3, and 6, rotatable turret 458 may be manually rotated to position any one of the objective lens systems of microscope 310 in an operative position at which the selected objective lens system is aligned with an ocular lens system 502 of the microscope and with vertical optical axis 166, when floating unit 24 is in its central position. The ocular lens system of microscope 310 is constructed and fixedly mounted on inner housing 440 above rotatable turret 458 in the same manner as shown and described in connection with FIGS. 1–3, 7, 9, and 10 of U.S. Pat. No. 3,490,846. When the selected objective lens system 462 is in the operative position aligned with ocular lens system 502, microscope 310 provides the operator with a magnified view of the pattern-bearing surface of mask 178 and an image of the selected region of the photosensitive-film-bearing surface of wafer 52. Rotatable turret 458 may also be manually rotated to position exposure lens system 362 in its operative position aligned with horizontal optical axis 470 and with vertical optical axis 166, once floating unit 24 is in its central position. The operator may then actuate solenoid-operated shutter 490 as required to expose the selected region of the photosensitive-film-bearing surface of wafer 52 in accordance with the pattern of mask 178.

As best shown in FIGS. 1–3 and 7, floating unit 24 includes a wafer loading and stepping structure 600 mounted on an upright portion 93 of floating unit housing 33 at side 284 thereof. Wafer loading and stepping structure 600 comprises a loading arm 604 fixedly secured to a cylindrical shaft 606, which is in turn rotatably supported by a journal box 608 fixedly secured to a vertical side plate 610 of the wafer loading and stepping structure. Side plate 610 is fixedly secured to a square top plate 516 of an X-Y stage 518, in which top plate 516 is reciprocally mounted on a square intermediate plate 520 by bearing supports 522 and in which intermediate plate 520 is reciprocally mounted on a square base plate 524 by bearing supports 526 oriented at right angles to bearing supports 522. A roller bearing is rotatably and pivotally mounted within a recessed portion of top plate 516 and is spring loaded for successively engaging a plurality of vertically arranged indentations (for example, three) in a detent plate fixedly secured to an adjacent recessed portion of intermediate plate 520. This provides X-Y stage 518 with a plurality of vertical detent positions. Top plate 516 is counterbalanced by springs attached between a lower portion of the top plate and an upper portion of intermediate plate 520 so that top plate 516 may be moved upward or downward between these vertical detent positions with equal ease.

A roller bearing is also rotatably and pivotally mounted within a recessed portion of intermediate plate 520 and is spring loaded for successively engaging a plurality of horizontally arranged indentations (for example, three) in another detent plate fixedly secured to an adjacent recessed portion of base plate 524. This provides X-Y stage 518 with three horizontal detent positons. Intermediate plate 520 does not need to be counterbalanced since it only moves horizontally with respect to base plate 524. A cylindrical lever 528 axially extending through circular apertures in side plate 610, and base plate 524 and enlarged circular aperture 534 in top plate 516 and intermediate plate 520 is pivotally secured toward one end thereof to base plate 524 by a spherical ball joint 530 and toward the other end thereof to side plate 610 by another spherical ball joint 532. Side plate 610 and, hence, loading arm 604 may therefore be moved to any of the vertical or horizontal detent positions by moving lever 528. Base plate 524 of X–Y stage 518 is fixedly mounted on the upright portion 93 of floating unit housing 33 so that loading arm 604 may be employed for transferring wafer 52 between wafer chuck 28 and a loading station fixedly, but adjustably, secured to side plate 610.

A driven gear fixedly secured to shaft 606 is engaged by a driver gear fixedly secured to another shaft, which is in turn rotatably supported by another journal box fixedly secured to side plate 610. The piston of a fifth air cylinder is pivotally secured to a lever fixedly attached to the driver gear, and the fifth air cylinder itself is pivotally secured to the upright portion of floating unit housing 33. Thus, by actuating an eighth solenoid-operated control valve to connect the source of air pressure to a ninth flexible tube communicating with the fifth air cylinder, the driven gear and, hence, loading arm 604 may be rotated counterclockwise to transfer wafer 52 from the loading station to wafer chuck 28. A mechanical stop and a position sensor comprising a light source and a photodiode may be employed to stop the counterclockwise rotational movment of loading arm 604 when the loading arm is precisely positioned as required to deposit wafer 52 in the proper position on wafer chuck 28. Loading arm 604 may be rotated clockwise to return wafer 52 from wafer chuck 28 to the loading station by actuating the eighth solenoid-operated control valve to vent the ninth flexible tube to the atmosphere thereby permitting expansion of a return spring mounted within the fifth air cylinder. Another mechanical stop may be employed to stop the clockwise rotational movement of loading arm 604 when the loading arm is positioned as required to redeposit wafer 52 at the loading station.

The loading station has a perforated top plate which may be connected via a ninth control valve and a tenth flexible tube to the source of vacuum to hold wafer 52 in place on the loading station. The perforated top plate may also be connected via a tenth control valve and an eleventh flexible tube to the source of air pressure to help transfer wafer 52 from loading station 536 to loading arm 604. The loading arm itself may be similarly connected to the source of vacuum to pick up the wafer and hold it in place thereon and to the source of air pressure to transfer the wafer to the wafer chuck and the loading station.

Wafer chuck 28, annular reference plate 30, copy lens system 32, mirror 168, and mask holder 164 are arranged so that the copy lens system produces an image of the selected region of the photosensitive-film-bearing surface of wafer 52 at the pattern-bearing surface of mask 178 and further produces an image of the pattern-bearing surface of the mask at a vertical plane disposed parallel to the annular reference surface of the annular reference plate and orthogonally intersecting horizontal optical axis 34 between the annular reference plate and the wafer chuck. In the operation of the projection alignment and exposure system, wafer chuck 28 is moved forward toward annular reference plate 30 to position, an unused marginal portion of the photosensitive-film-bearing surface of wafer 52 in face-to-face abutment with the annular reference surface of the annular reference plate. This pivots wafer chuck 28 about horizontal optical axis 34 as required to orient the photosensitive-film-bearing surface of wafer 52 in parallel plane alignment with the image plane of the pattern-bearing surface of mask 178. Wafer chuck 28 is then moved backward away from annular reference plate 30 until convex portion 92 of chuck holder 40 abuts upon micrometer screw 90. Micrometer screw 90 may thereupon be manually adjusted, while viewing the pattern-bearing surface of mask 178 and the image of the selected region of the photosensitive-film-bearing surface of wafer 28 through microscope 310, to move vacuum chuck 28 forward or backward as required to precisely position the selected region of the photosensitive-film-bearing surface of wafer 52 at the image plane of the pattern-bearing surface of mask 178. This can only be done when a mark or pattern has previously been formed on the selected surface region of wafer 52. If no mark or pattern has been previously formed on the selected wafer region of surface 52, a stop mechanism 140 may be employed to automatically stop the backward movement of wafer chuck 28 away from annular reference plate 30 when the selected surface region of wafer 52 is positioned in the image plane of the patternbearing surface of mask 178. Stop mechanism 140 comprises a rectangular block 142 fixedly secured to a flattened lower portion of sleeve-like cylindrical part 74 and positioned between end portions 144 and 146 of a stop member 148 slidable supported upon a plate 150 secured to base 152 of floating unit housing 33. An adjustment screw 154 is threadedly mounted in end portion 144 of stop member 148 so that the spacing $L_1$ between the inner surface of end portion 146 of the stop member and the adjacent surface of block 142, when the block 142 is positioned in abutment upon the adjustment screw, may be set equal to the spacing $L_2$ between the annular reference surface of annular reference plate 30 and the image plane of the pattern-bearing surface of mask 178. Thus, as wafer chuck 28 is moved forward toward annular reference plate 30, block 142 moves into abutment upon the inner surface of end portion 146 of stop member 148 and thereafter moves the stop member forward with the wafer chuck. Once the photosensitive-film-bearing surface of wafer 52 is positioned in face-to-face abutment with the annular reference surface of annular reference plate 30, stop member 148 is vacuum clamped in place on plate 150 by drawing a vacuum through a passageway extending through plate 150 and communicating with a recessed region 158 in the adjacent lower surface of the stop member. This is accomplished by actuating an eleventh solenoid-operated control valve to connect a twelfth flexible tube communicating with this passageway to the source of vacuum. As wafer chuck 28 is moved backward away from annular reference plate 30, block 142 therefore moves into abutment upon the end of adjustment screw -154. This automatically stops the backward movement of wafer chuck 28 when the photosensitive-film-bearing surface of wafer 52 is substantially positioned in the image plane of the pattern-bearing surface of mask 178 since the spacing $L_1$ between the inner surface of end portion 146 of stop member 148 and the adjacent surface of block 142, when the block is positioned in abutment upon adjustment screw 154, is equal to the spacing $L_2$ between the reference surface of annular reference plate 30 and the image plane of the pattern-bearing surface of mask 178. Stop member 148 may be unclamped to permit further backward movement of wafer chuck 28 by actuating the eleventh solenoid-operated control valve to vent the twelth flexible tube associated therewith to the atmosphere.

Following this wafer focusing operation, the selected region of the photosensitive-film-bearing surface of wafer 52 may be exposed in accordance with the pattern of mask 178, if no other patterns have been previously formed on the wafer. Wafer loading and stepping structure 600 may then be employed to step the wafer to different positions on wafer chuck 28 so that corresponding different regions of the photosensitive-film-bearing surface of the wafer may also be exposed in accordance with the mask. However, if a pattern has been previously formed on the selected surface region of wafer 52, floating unit 24 is scanned relative to optical unit 26 and mask holder 164 is moved relative to wafer chuck 28, while viewing the pattern-bearing surface of mask 178 and the image of the selected surface region of the wafer, as required to bring different portions of the mask and the image of the selected surface region of the wafer into the field of view of microscope 310 and to align and verify the alignment of the pattern of the mask with the pattern previously formed on the selected surface region of the wafer. During this pattern alignment operation, mask 178 only has to be moved in a horizontal plane orthogonally intersecting vertical optical axis 166, and wafer 52 does not have to be moved at all. Neither the wafer nor the mask has to be moved thereafter until the pattern of the mask has been projected onto the selected region of photosensitive-film-bearing surface 50 of the wafer. Mask holder 164 and wafer chuck 28 therefore do not have to be mounted for movement other than as described above. This makes it possible to substantially increase the stability of wafer chuck 28 and mask holder 164 and thereby help maintain the parallel-plane alignment established between the photosensitive-film-bearing surface of wafer 52 and the annular reference surface of annular reference plate 30 and the pattern alignment established between the pattern-bearing surface of mask 178 and the selected surface region of the wafer. Following this pattern-alignment operation, floating unit 24 is returned to its central position. Concomitantly, exposure lens system 362 is rotated to its operative position, and solenoid operated shutter 490 (see FIG. 6) is actuated to permit exposure of the photosensitive film on the selected surface region of the wafer in accordance with the pattern of the mask. These alignment and exposure operations may be repeated for other pattern-bearing surface regions of the wafer by employing loading and stepping structure 600 to step the wafer to different positions on wafer chuck 28.

I claim:

1. A projection alignment and exposure system comprising:
    a base unit;
    a floating unit floatingly supported on the base unit;
    a wafer chuck, a reference member, a projection lens system, and a mask holder mounted on the floating unit so that the projection lens system is operable for producing an image of a selected region of a photosensitive-film-bearing surface of a wafer supported on the wafer chuck at a pattern-bearing surface of a mask supported on the mask holder and for producing an image of the pattern-bearing surface of the mask in an image plane positioned between the reference member and the wafer chuck and oriented parallel to a reference surface of the reference member;
    said wafer chuck being movably mounted for positioning the photosensitive-film-bearing surface of the wafer in abutment with the reference surface of the reference member and for thereafter positioning the selected region of the photosensitive-film-bearing surface of the wafer at the image plane of the pattern-bearing surface of the mask;
    said mask holder being movable mounted for aligning the patternbearing surface of the mask with the selected region of the photosensitive-film-bearing surface of the wafer; and
    an optical unit mounted on the base unit above the mask holder for providing a magnified view of the pattern-bearing surface of the mask and the image of the selected region of the photosensitive-film-bearing surface of the wafer while they are being aligned and for thereafter exposing the selected region of the photosensitive-film-bearing surface of the wafer.

2. A projection alignment and exposure system as in claim 1 including means for stepping the wafer relative to the mask holder and the optical unit.

3. A projection alignment and exposure system as in claim 1 wherein:
    said wafer chuck, reference member, and projection lens system are mounted along a horizontal optical axis; and
    said mask holder is mounted along a vertical optical axis orthogonally intersecting the horizontal optical axis at an inclined mirror also mounted on the floating unit.

4. A projection alignment and exposure system as in claim 1 wherein said floating unit is floatingly supported on the base unit by three balls mounted at three spaced positions on the base unit.

5. A projection alignment and exposure system as in claim 4 including control means coupled to the base unit and to the floating unit for scanning the floating unit relative to the base unit and the optical unit.

6. A projection alignment and exposure system as in claim 5 wherein said control means comprises:
    a control handle; and
    a shaft pivotally secured toward one end thereof to the base unit, pivotally secured toward the other end thereof to the control handle, and pivotally secured intermediate the ends thereof to the floating unit.

7. A projection alignment and exposure system as in claim 5 including a parallelogram linkage for coupling the floating unit to the base unit to prevent the floating unit from rotating relative to the base unit and the optical unit while the floating unit is being scanned relative to the base unit and the optical unit.

8. A projection alignment and exposure system as in claim 7 wherein said parallelogram linkage comprises:
    a common link;
    a first pair of shorter links each pivotally secured at one end thereof to one end of the common link; and
    a second pair of shorter links each pivotally secured at one end thereof to the other end of the common link;
    one of said first pair of shorter links and one of said second pair of shorter links each being pivotally secured at the other end thereof to the base unit; and the other of said first pair of shorter links and the other of said second pair of shorter links each being pivotally secured at the other end thereof to the floating unit.

9. A projection alignment and exposure system as in claim 7 including clamping means for clamping the floating unit to the base unit to hold the floating unit in any position to which it may be scanned relative to the base unit and the optical unit.

10. A projection alignment and exposure system as in claim 9 wherein said clamping means comprises:
a spring member fixedly secured to one of the base unit and the floating unit;
at least one vacuum clamping member fixedly secured to the spring member and disposed in slidable engagement with the other of the base unit and the floating unit; and
means coupled to each vacuum clamping member for connecting it to a source of vacuum to vacuum clamp the floating unit to the base unit and for subsequently disconnecting each vacuum clamping member from the source of vacuum to unclamp the floating unit from the base unit.

11. A projection alignment and exposure system as in claim 10 wherein:
said spring member comprises a leaf spring fixedly secured to the base unit; and
a pair of vacuum clamping members is fixedly secured toward opposite ends of the leaf spring and disposed in slidable engagement with the floating unit.

12. A projection alignment and exposure system as in claim 9 including centering means for automatically moving the floating unit to a central position at which an optical axis passing through the mask supported on the mask holder is aligned with an exposure lens system of the optical unit when the exposure lens system is in its operative position.

13. A projection alignment and exposure system as in claim 12 wherein said centering means comprises:
a plurality of roller members pivotally mounted on one of the base unit and the floating unit and disposed within an aperture in the other of the base unit and the floating unit for movement between a clustered inoperative position out of engagement with said other of the base unit and the floating unit to permit scanning of the floating unit from the central position and an extended operative position in engagement with said other of the base unit and the floating unit to return the floating unit to the central position when the floating unit is not clamped to the base unit by the clamping means; and
drive means coupled to the roller members for driving the roller members between their clustered inoperative position and their extended operative position.

14. A projection alignment and exposure system as in claim 13 wherein said drive means comprises:
a plurality of shafts rotatably mounted on the base unit at symmetrically spaced positions adjacent to a circular aperture in the floating unit;
a plurality of levers each fixedly secured to an associated different one of said plurality of shafts, said plurality of roller members each being rotatably mounted on an associated different one of the levers for movement between the clustered inoperative position out of engagement with the floating unit and the extended operative position in engagement with the floating unit;
a plurality of gears each fixedly secured to an associated different one of said plurality of shafts; and
means, including another gear rotatably mounted on the base unit in engagement with said plurality of gears, for rotating said plurality of gears to drive the roller members between their clustered inoperative position and their extended operative position.

15. A projection alignment and exposure system as in claim 14 wherein:
said plurality of roller members comprises three roller bearings;
said plurality of shafts comprises three cylindrical shafts;
said plurality of levers comprises three levers;
said plurality of gears comprises three gears; and
said last-mentioned means further includes an outwardly extending portion of one of the levers coupled to a drive mechanism for selectively rotating said plurality of gears.

16. A projection alignment and exposure system as in claim 1 wherein:
said wafer chuck is mounted for translational movement only along an optical axis of the wafer chuck and the reference member; and
said mask holder is mounted for translational movement along at least two orthogonal axes lying in a plane orthogonally intersecting an optical axis of the mask holder and the optical unit to permit alignment of the pattern-bearing surface of the mask with the image of the selected region of the photosensitive-film-bearing surface of the wafer.

17. A projection alignment and exposure system as in claim 16 including:
a guide member fixedly mounted on the floating unit and coaxially disposed along the optical axis of the wafer chuck and the reference member;
a piston member coaxially and slidably supported by the guide member for translational movement only along the optical axis of the wafer chuck and the reference member, said wafer chuck being mounted on the piston member for pivotal movement about the optical axis of the wafer chuck and the reference member;
clamping means coupled to the wafer chuck for clamping the wafer chuck to the piston member in whatever position the wafer chuck may be pivoted to by abutment of the photosensitive-film-bearing surface of the wafer with the reference surface of the reference member; and
drive means coupled to the piston member for driving the wafer chuck along the optical axis of the wafer chuck and the reference member between the image plane of the pattern-bearing surface of the mask and the reference surface of the reference member.

18. A projection alignment and exposure system as in claim 17 including micrometer adjustment means mounted in the guide member and disposed for abutment with the piston member to stop the translational movement of the wafer chuck away from the reference member at a selected position.

19. A projection alignment and exposure system as in claim 18 wherein said piston member is spring biased against the micrometer adjustment means when they are brought into abutment so that the micrometer adjustment means may be employed to precisely adjust the position of the wafer chuck to locate the selected region of the photosensitive-film-bearing surface of the wafer at the image plane of the pattern-bearing surface of the mask.

20. A projection alignment and exposure system as in claim 19 including stop means for automatically stopping the translational movement of the wafer chuck away from the reference member when the selected region of the photosensitive-film-bearing surface of the wafer is located in the region of the image plane of the pattern-bearing surface of the mask.

21. A projection alignment and exposure system as in claim 20 wherein said stop means comprises:
a first member slidably supported on the floating unit;
a second member fixedly secured to the piston member and disposed between a pair of spaced opposite end portions of the first member for abutment upon one end portion of the first member when the wafer chuck is moved to a first position at which the photosensitive-film-bearing surface of the wafer is brought into abutment with the reference surface of the reference member and for abutment upon the other end portion of the first member when the wafer chuck is moved to a second position spaced away from the reference member;
an adjustment screw mounted in said other end portion of the first member for abutment with the adjacent end of the second member to adjust the spacing between the other end of the second member and said one end portion of the first member to equal the spacing between the reference surface of the reference member and the image plane of the pattern-bearing surface of the mask; and
clamping means coupled to the first member for clamping the first member to the floating unit when the wafer chuck is moved to the first position so that subsequent translational movement of the wafer chuck away from the reference member is automatically stopped when the selected region of the photosensitive-film-bearing surface of the wafer is positioned in the image plane of the pattern-bearing surface of the mask.

22. A projection alignment and exposure system as in claim 16 including stepping means for selectively moving the wafer to different positions on the wafer chuck to permit alignment of the pattern-bearing surface of the mask with different selected regions of the photosensitive-film-bearing surface of the wafer.

23. A projection alignment and exposure system as in claim 22 wherein said stepping means comprises:
an X-Y stage mounted on the floating unit adjacent to the wafer chuck, said X-Y stage having a plurality of different detent positions;
a wafer loading arm rotatably mounted on the X-Y stage for transferring the wafer between the wafer chuck and a wafer loading station when the X-Y stage is in one of tis detent positions and for moving the wafer to different positions on the wafer chuck when the X-Y stage is moved to different ones of its detent positions; and
means coupled to the X-Y stage for selectively moving it to different ones of its detent positions.

24. A projection alignment and exposure system as in claim 16 including:
an X-Y stage mounted on the floating unit; and
a rotational stage mounted on the X-Y stage, said mask holder being mounted on the rotational stage.

25. A projection alignment and exposure system as in claim 22 wherein said projection lens system includes an alignment lens pivotally mounted at one end of the projection lens system for movement between an operative position to adjust the projection lens system for use with illuminating light and an inoperative position to adjust the projection lens system for use with exposure light.

26. A projection alignment and exposure system as in claim 25 wherein said optical unit includes:
an ocular lens system fixedly mounted on the optical unit;
a plurality of objective lens systems rotatably mounted on the optical unit at different positions, each of said objective lens systems being aligned with the ocular lens system when rotated to an operative position;
a source of illumination light for the objective lens systems;
an exposure lens system rotatably mounted on the optical unit at a still different position; and
a source of exposure light for the exposure lens system;
said exposure lens system being aligned with the source of exposure light when rotated to the operative position.

27. A projection alignment and exposure system as in claim 22 wherein said projection lens system may comprise any one of a 10:1, 4:1, 2:1, and 1:1 copy lens system.

28. A projection alignment and exposure system as in claim 3 including:
means for adjustably positioning the inclined mirror at forty-five degrees relative to both the horizontal and vertical optical axes; and
means for holding the inclined mirror in place once it is so positioned.

29. A projection alignment and exposure system as in claim 26 including means coupled to the source of illumination light for transmitting it in a plurality of spaced beams to the photosensitive-film-bearing surface of the wafer supported on the wafer chuck.

30. Alignment and exposure apparatus comprising:
a housing;
a workpiece chuck, a reference member, a projection lens system, and a mask holder mounted on the housing so that the projection lens system is operable for producing an image of a selected region of a photosensitive-filmbearing surface of a workpiece supported on the workpiece chuck at a pattern-bearing surface of a mask supported on the mask holder and for producing an image of the pattern-bearing surface of the mask in an image plane positioned between the reference member and the workpiece chuck and oriented parallel to a reference surface of the reference member;
said workpiece chuck being mounted for translational movement only along an optical axis of the wafer chuck and the reference member to position the photosensitive-film-bearing surface of the workpiece in abutment with the reference surface of the reference member and for thereafter positioning the selected region of the photosensitive-film-bearing surface of the workpiece at the image plane of the pattern-bearing surface of the mask;

said mask holder being movably mounted for translational movement along at least two orthogonal axes lying in a plane orthogonally intersecting an optical axis of the mask holder to align the pattern-bearing surface of the mask with the selected region of the photosensitive-film-bearing surface of the workpiece; and an optical unit mounted on the housing above the mask holder for providing a magnified view of the pattern-bearing surface of the mask and the image of the selected region of the photosensitive-film-bearing surface of the workpiece while they are being aligned and for thereafter exposing the selected region of the photosensitive-film-bearing surface of the workpiece.

31. A projection alignment and exposure system as in claim 1 including control means coupled to the base unit and to the floating unit for scanning the floating unit relative to the base unit and the optical unit.

32. A projection alignment and exposure system as in claim 31 including a parallelogram linkage for coupling the floating unit to the base unit to prevent the floating unit from rotating relative to the base unit and the optical unit while the floating unit is being scanned relative to the base unit and the optical unit.

33. A projection alignment and exposure system as in claim 32 wherein said parallelogram linkage comprises:
 a common link;
 a first pair of shorter links each pivotally secured at one end thereof to one end of the common link; and
 a second pair of shorter links each pivotally secured at one end thereof to the other end of the common link;
 one of said first pair of shorter links and one of said second pair of shorter links each being pivotally secured at the other end thereof to the base unit; and
 the other of said first pair of shorter links and the other of said second pair of shorter links each being pivotally secured at the other end thereof to the floating unit.

34. A projection alignment and exposure system as in claim 31 including clamping means for clamping the floating unit to the base unit to hold the floating unit in any position to which it may be scanned relative to the base unit and the optical unit.

35. A projection alignment and exposure system as in claim 34 wherein said clamping means comprises:
 a spring member fixedly secured to one of the base unit and the floating unit;
 at least one vacuum clamping member fixedly secured to the spring member and disposed in slidable engagement with the other of the base unit and the floating unit; and
 means coupled to each vacuum clamping member for connecting it to a source of vacuum to vacuum clamp the floating unit to the base unit and for subsequently disconnecting each vacuum clamping member from the source of vacuum to unclamp the floating unit from the base unit.

36. A projection alignment and exposure system as in claim 31 including centering means for automatically moving the floating unit to a central position at which an optical axis passing through the mask supported on the mask holder is aligned with an exposure lens system of the optical unit when the exposure lens system is in its operative position.

37. A projection alignment and exposure system as in claim 36 wherein said centering means comprises:
 a plurality of roller members pivotally mounted on one of the base unit and the floating unit and disposed within an aperture in the other of the base unit and the floating unit for movement between a clustered inoperative position out of engagement with said other of the base unit and the floating unit to permit scanning of the floating unit from the central position and an extended operative position in engagement with said other of the base unit and the floating unit to return the floating unit to the central position; and
 drive means coupled to the roller members for driving the roller members between their clustered inoperative position and their extended operative position.

38. A projection alignment and exposure system as in claim 1 including:
 a guide member fixedly mounted on the floating unit and coaxially disposed along the optical axis of the wafer chuck and the reference member;
 a piston member coaxially and slidably supported by the guide member for translational movement along the optical axis of the wafer chuck and the reference member, said wafer chuck being mounted on the piston member for pivotal movement about the optical axis of the wafer chuck and the reference member;
 clamping means coupled to the wafer chuck for clamping the wafer chuck to the piston member in whatever position the wafer chuck may be pivoted to by abutment of the photosensitive-film-bearing surface of the wafer with reference surface of the reference member; and
 drive means coupled to the piston member for driving the wafer chuck along the optical axis of the wafer chuck and the reference member between the image plane of the pattern-bearing surface of the mask and the reference surface of the reference member.

39. A projection alignment and exposure system as in claim 38 including micrometer adjustment means mounted in the guide member and disposed for abutment with the piston member to stop the translational movement of the wafer chuck away from the reference member at a selected position.

40. A projection alignment and exposure system as in claim 39 wherein said piston member is spring biased against the micrometer adjustment means when they are brought into abutment so that the micrometer adjustment means may be employed to precisely adjust the position of the wafer chuck to locate the selected region of the photosensitive-film-bearing surface of the wafer at the image plane of the pattern-bearing surface of the mask.

41. A projection alignment and exposure system as in claim 38 including stop means for automatically stopping the translational movement of the wafer chuck away from the reference member when the selected region of the photosensitive-film-bearing surface of the wafer is located in the region of the image plane of the pattern-bearing surface of the mask.

42. A projection alignment and exposure system as in claim 41 wherein said stop means comprises:
 a first member slidably supported on the floating unit;

a second member fixedly secured to the piston member and disposed between a pair of spaced opposite end portions of the first member for abutment upon one end portion of the first member when the wafer chuck is moved to a first position at which the photosensitive-film-bearing surface of the wafer is brought into abutment with the reference surface of the reference member and for abutment upon the other end portion of the first member when the wafer chuck is moved to a second position spaced away from the reference member;

an adjustment screw mounted in said other end portion of the first member for abutment with the adjacent end of the second member to adjust the spacing between the other end of the second member and said one end portion of the first member to equal the spacing between the reference surface of the reference member and the image plane of the pattern-bearing surface of the mask; and clamping means coupled to the first member for clamping the first member to the floating unit when the wafer chuck is moved to the first position so that subsequent translational movement of the wafer chuck away from the reference member is automatically stopped when the selected region of the photosensitive-film-bearing surface of the wafer is positioned in the image plane of the pattern-bearing surface of the mask.

43. A projection alignment and exposure system as in claim 1 including stepping means for selectively moving the wafer to different positions on the wafer chuck to permit alignment of the patternbearing surface of the mask with different selected regions of the photosensitive-film-bearing surface of the wafer.

44. A projection alignment and exposure system as in claim 43 wherein said stepping means comprises:

an X-Y stage mounted on the floating unit adjacent to the wafer chuck, said X-Y stage having a plurality of different detent positions;

a wafer loading arm rotatably mounted on the X-Y stage for transferring the wafer between the wafer chuck and a wafer loading station when the X-Y stage is in one of its detent positions and for moving the wafer to different positions on the wafer chuck when the X-Y stage is moved to different ones of its detent positions; and means coupled to the X-Y stage for selectively moving it to different ones of its detent positions.

45. A projection alignment and exposure system as in claim 1 wherein said projection lens system includes an alignment lens pivotally mounted at one end of the projection lens system for movement between an operative position to adjust the projection lens system for use with illuminating light and an inoperative position to adjust the projection lens system for use with exposure light.

46. A projection alignment and exposure system as in claim 45 wherein said optical unit includes:

an ocular lens system fixedly mounted on the optical unit;

a plurality of objective lens systems rotatably mounted on the optical unit at different positions, each of said objective lens systems being aligned with the ocular lens system when rotated to an operative position;

a source of illumination light for the objective lens systems;

an exposure lens system rotatably mounted on the optical unit at a still different position; and a source of exposure light for the exposure lens system;

said exposure lens system being aligned with the source of exposure light when the rotated to the operative position.

47. A projection alignment and exposure system as in claim 46 including means coupled to the source of illumination light for transmitting it in a plurality of spaced beams to the photosensitive-film-bearing surface of the wafer supported on the wafer chuck.

48. A projection alignment and exposure system as in claim 1 wherein said projection lens system may comprise any one of a 10:1, 4:1, 2:1, and 1:1 copy lens system.

49. A projection alignment and exposure system as in claim 30 including means for stepping the wafer relative to the mask holder and the optical unit.

50. A projection alignment and exposure system as in claim 30 wherein:

said workpiece chuck, reference member, and projection lens system are mounted along a horizontal optical axis; and said mask holder is mounted along a vertical optical axis orthogonally intersecting the horizontal optical axis at an inclined mirror also mounted on the housing.

51. A projection alignment and exposure system as in claim 50 including:

means for adjustably positioning the inclined mirror at fortyfive degrees relative to both the horizontal and vertical optical axes: and means for holding the inclined mirror in place once it is so positioned.

52. A projection alignment and exposure system as in claim 30 including:

a guide member fixedly mounted on the housing and coaxially disposed along the optical axis of the workpiece chuck and the reference member;

a piston member coaxially and slidably supported by the guide member for translational movement only along the optical axis of the workpiece chuck and the reference member, said workpiece chuck being mounted on the piston member for pivotal movement about the optical axis of the workpiece chuck aand the reference member;

clamping means coupled to the workpiece chuck for clamping the workpiece chuck to the piston member in whatever position the workpiece chuck may be pivoted to by abutment of the photosensitive-film-bearing surface of the workpiece with the reference surface of the reference member; and drive means coupled to the piston member for driving the workpiece chuck along the optical axis of the workpiece chuck and the reference member between the image plane of the pattern-bearing surface of the mask and the reference surface of the reference member.

53. A projection alignment and exposure system as in claim 52 including micrometer adjustment means mounted in the guide member and disposed for abutment with the piston member to stop the translational movement of the workpiece chuck away from the reference member at a selected position.

54. A projection alignment and exposure system as in claim 53 wherein said piston member is spring biased against the micrometer adjustment means when they are brought into abutment so that the micrometer adjustment means may be employed to precisely adjust the position of the workpiece chuck to locate the selected region of the photosensitive-film-bearing surface of the workpiece at the image plane of the pattern-bearing surface of the mask.

55. A projection alignment and exposure system as in claim 52 including stop means for automatically stopping the translational movement of the workpiece chuck away from the reference member when the selected region of the photosensitive-film-bearing surface of the workpiece is located in the region of the image plane of the patternbearing surface of the mask.

56. A projection alignment and exposure system as in claim 55 wherein said stop means comprises:
   a first member slidably supported on the housing;
   a second member fixedly secured to the piston member and disposed between a pair of spaced opposite end portions of the first member for abutment upon one end portion of the first member when the workpiece chuck is moved to a first position at which the photosensitive-film-bearing surface of the workpiece is brought into abutment with the reference surface of the reference member and for abutment upon the other end portion of the first member when the workpiece chuck is moved to a second position spaced away from the reference member;
   an adjustment screw mounted in said other end portion of the first member for abutment with the adjacent end of the second member to adjust the spacing between the other end of the second member and said one end portion of the first member to equal the spacing between the reference surface of the reference member and the image plane of the pattern-bearing surface of the mask; and
   clamping means coupled to the first member for clamping the first member to the housing when the workpiece chuck is moved to the first position so that subsequent translational movement of the workpiece chuck away from the reference member is automatically stopped when the selected region of the photosensitive-film-bearing surface of the workpiece is positioned in the image plane of the pattern-bearing surface of the mask.

57. A projection alignment and exposure system as in claim 30 including stepping means for selectively moving the workpiece to different positions on the workpiece chuck to permit alignment of the pattern-bearing surface of the mask with different selected regions of the photosensitive-film-bearing surface of the workpiece.

58. A projection alignment and exposure system as in claim 57 wherein said stepping means comprises:
   an X-Y stage mounted on the housing adjacent to the workpiece chuck, said X-Y stage having a plurality of different detent positions;
   a workpiece loading arm rotatably mounted on the X-Y stage for transferring the workpiece between the workpiece chuck and a workpiece loading station when the X-Y stage is in one of its detent positions and for moving the workpiece to different positions on the workpiece chuck when the X-Y stage is moved to different ones of its detent positions; and
   means coupled to the X-Y stage for selectively moving it to different ones of its detent positions.

59. A projection alignment and exposure system as in claim 30 including:
   an X-Y stage mounted on the housing; and
   a rotational stage mounted on the X-Y stage, said mask holder being mounted on the rotational stage.

60. A projection alignment and exposure system as in claim 30 wherein said projection lens system includes an alignment lens pivotally mounted at one end of the projection lens system for movement between an operative position to adjust the projection lens system for use with illuminating light and an inoperative position to adjust the projection lens system for use with exposure light.

61. A projection alignment and exposure system as in claim 60 wherein said optical unit includes:
   an ocular lens system fixedly mounted on the optical unit;
   a plurality of objective lens systems rotatably mounted on the optical unit at different positions, each of said objective lens systems being aligned with the ocular lens system when rotated to an operative position;
   a source of illumination light for the objective lens systems;
   an exposure lens system rotatably mounted on the optical unit at a still different position; and
   a source of exposure light for the exposure lens system;
   said exposure lens system being aligned with the source of exposure light when rotated to the operative position.

62. A projection alignment and exposure system as in claim 61 including means coupled to the source of illumination light for transmitting it in a plurality of spaced beams to the photosensitivefilm-bearing surface of the workpiece supported on the workpiece chuck.

63. A projection alignment and exposure system as in claim 30 wherein said projection lens system may comprise any one of a 10:1, 4:1, 2:1, and 1:1 copy lens system.

64. A projection alignment and exposure system comprising:
   a base unit;
   a floating unit floatingly supported on the base unit;
   a wafer chuck, an annular reference plate, a copy lens system, and a mask holder mounted on the floating unit so that the copy lens system is operable for producing an image of a selected region of a photosensitive-film-bearing surface of a wafer supported on the wafer chuck at a pattern-bearing surface of a mask supported on the mask holder and for producing an image of the pattern-bearing surface of the mask in an image plane positioned between the annular reference plate and the wafer chuck and oriented parallel to a reference surface of the annular reference plate;
   said wafer chuck being movably mounted for positioning the photosensitive-film-bearing surface of the wafer in abutment with the reference surface of the annular reference plate and for thereafter positioning the selected region of the photosensitive-filmbearing surface of the wafer at the image plane of the patternbearing surface of the mask;
   said mask holder being movably mounted for aligning the patternbearing surface of the mask with the selected region of the photosensitive-film-bearing surface of the wafer; and an optical unit mounted on the base unit above the mask holder for providing a magnified view of the pattern-bearing surface of the mask and the image of the selected region of the photosensitive-film-bearing surface of the wafer while they are being aligned and for thereafter exposing the selected region of the photosensitive-film-bearing surface of the wafer.

65. A projection alignment and exposure system as in claim 64 including means for stepping the wafer relative to the mask holder and the optical unit.

66. A projection alignment and exposure system as in claim 64 wherein:
said wafer chuck, annular reference plate, and copy lens system are mounted along a horizontal optical axis; and
said mask holder is mounted along a vertical optical axis orthogonally intersecting the horizontal optical axis at an inclined mirror also mounted on the floating unit.

* * * * *

UNITED STATES PATENT AND TRADEMARK OFFICE
CERTIFICATE OF CORRECTION

PATENT NO. : 3,940,211

DATED : February 24, 1976

INVENTOR(S) : Karl-Heinz Johannsmeier

It is certified that error appears in the above-identified patent and that said Letters Patent are hereby corrected as shown below:

Column 1, line 14, between "step-and" and "repeat" insert a hyphen;

Column 3, line 2, delete "reference" (second occurrence); line 11, between "annular" (second occurrence) and "plate" insert -- reference --;

Column 7, line 15, after "position" insert -- by actuating the third solenoid-operated control valve to vent --; line 21, before "be" insert -- could --;

Column 9, line 64, "this" should read -- This --;

Column 10, line 8, "bearing" should read -- bearings --;

Column 11, line 12, "solenoidoperated" should read -- solenoid-operated --; line 29, "in" should read -- In --;

Column 12, line 14, "patternbearing" should read -- pattern-bearing --; line 41, "splitfield" should read -- split-field; line 47, "are" should read -- arc --;

Column 13, line 6, "500" should read -- five-hundred --; line 26, "500" should read -- five-hundred --; line 43, "solenoidoperated" should read -- solenoid-operated --; line 67, "1,900A" should read -- 1900A --;

Column 14, line 67, delete the comma;

Column 16, line 19, "wafer" should read -- surface --, and "surface" should read -- wafer --; line 24 "patternbearing" should read -- pattern-bearing --; line 28, "slidable" should read -- slidably --;

UNITED STATES PATENT AND TRADEMARK OFFICE
CERTIFICATE OF CORRECTION

PATENT NO. : 3,940,211
DATED : February 24, 1976
INVENTOR(S) : Karl-Heinz Johannsmeier It is certified that error appears in the above-identified patent and that said Letters Patent are hereby corrected as shown below:

Column 18, line 10, "movable" should read -- movably --; line 11, "patternbearing" should read -- pattern-bearing --;

Column 20, line 5, the phrase beginning on this line should start a new subparagraph;

Column 21, line 60, "tis" should read -- its --;

Column 22, line 51, "photosensitive-filmbearing" should read -- photosensitive-film-bearing --;

Column 24, line 34, between "with" and "reference" insert -- the --;

Column 25, line 32, "patternbearing" should read -- pattern-bearing --;

Column 26, line 6, delete "the" (first occurrence); line 32, "fortyfive" should read -- forty-five --; line 33, the colon should be a semicolon; line 47, "aand" should read -- and --;

Column 27, line 13, "patternbearing" should read -- pattern-bearing --;

Column 28, line 35, "photosensitivefilm-bearing" should read -- photosensitive-film-bearing --; line 63, "filmbearing" should read -- film-bearing --; line 64, "patternbearing" should read -- pattern-bearing --; line 66, "patternbearing" should read -- pattern-bearing --.

Signed and Sealed this first Day of June 1976

[SEAL]

Attest:

RUTH C. MASON
Attesting Officer

C. MARSHALL DANN
Commissioner of Patents and Trademarks